(12) United States Patent
Kadohashi

(10) Patent No.: US 11,111,414 B2
(45) Date of Patent: Sep. 7, 2021

(54) POLISHING COMPOSITION

(71) Applicant: FUJIMI INCORPORATED, Kiyosu (JP)

(72) Inventor: Yusuke Kadohashi, Kiyosu (JP)

(73) Assignee: FUJIMI INCORPORATED, Kiyosu (JP)

(*) Notice: Subject to any disclaimer, the term of this patent is extended or adjusted under 35 U.S.C. 154(b) by 0 days.

(21) Appl. No.: 16/559,941

(22) Filed: Sep. 4, 2019

(65) Prior Publication Data

US 2020/0095466 A1  Mar. 26, 2020

(30) Foreign Application Priority Data

Sep. 20, 2018  (JP) .............................. JP2018-176459

(51) Int. Cl.
*C09G 1/02* (2006.01)
*H01L 21/321* (2006.01)
*H01L 21/306* (2006.01)

(52) U.S. Cl.
CPC .......... *C09G 1/02* (2013.01); *H01L 21/30625* (2013.01); *H01L 21/3212* (2013.01)

(58) Field of Classification Search
CPC . C09G 1/02; H01L 21/30625; H01L 21/3212; H01L 21/31053
See application file for complete search history.

(56) References Cited

U.S. PATENT DOCUMENTS

| | | | |
|---|---|---|---|
| 8,075,800 B2* | 12/2011 | Koyama | C09G 1/02 216/88 |
| 9,382,450 B2* | 7/2016 | Belmont | B82Y 30/00 |
| 2017/0081553 A1* | 3/2017 | Tamada | B24B 37/00 |

FOREIGN PATENT DOCUMENTS

JP  2017-057263 A  3/2017

* cited by examiner

*Primary Examiner* — Duy Vu N Deo
(74) *Attorney, Agent, or Firm* — Foley & Lardner LLP

(57) ABSTRACT

A polishing composition having a pH of less than 7, comprising an abrasive grain and an amide compound, wherein the amide compound has a group forming a Σ conjugated system with a carbonyl group.

9 Claims, No Drawings

POLISHING COMPOSITION

BACKGROUND

1. Technical Field

The present invention relates to a polishing composition.

2. Description of Related Arts

In recent years, due to multilayer wiring on a surface of a semiconductor substrate, a so-called chemical mechanical polishing (CMP) technique for polishing and planarizing a semiconductor substrate has been used, in producing a device. CMP is a method of planarizing a surface of an object to be polished (polishing object) such as a semiconductor substrate by using a polishing composition (slurry) containing an abrasive grain such as silica, alumina, or ceria, an anticorrosive, a surfactant, or the like, and the object to be polished (polishing object) is silicon, polysilicon, silicon oxides (silicon oxide), silicon nitride, a wire formed of metal or the like, a plug, and the like.

In a general method of CMP, a polishing pad is attached on a circular polishing table (platen), a surface of the polishing pad is immersed in a polishing agent, a surface on which a wiring layer of a substrate is formed is pressed, the polishing table is turned in a state that a predetermined pressure (polishing pressure) is applied from a rear surface thereof, and the wiring layer is removed by mechanical friction between the polishing agent and the wiring layer. For example, JP 2017-57263 A discloses a polishing composition capable of polishing a polysilicon film at a high polishing speed.

SUMMARY

Certainly, when the polishing composition disclosed in JP 2017-57263 A is used, the polysilicon film can be polished at a high polishing rate.

However, in the case of using the polishing composition disclosed in JP 2017-57263 A at a pH of less than 7, electrical conductivity of the polishing composition is increased. Thus, when an object to be polished including a silicon material such as polysilicon and a metal oxide (for example, $AlO_x$) is polished, there is a problem that a film including the metal oxide cannot be polished at a high polishing rate.

Therefore, an object of the present invention is to provide a polishing composition which can suppress an increase in electrical conductivity at a pH of less than 7 and polish both a silicon material and a metal oxide at a high polishing rate in polishing of an object to be polished including the silicon material and the metal oxide.

The present inventor has intensively studied to solve the above problem. As a result, the present inventor found that the problem can be solved by a polishing composition having a pH of less than 7, including an abrasive grain and an amide compound, in which the amide compound has a group forming a n conjugated system with a carbonyl group.

DETAILED DESCRIPTION

An embodiment of the present invention is a polishing composition having a pH of less than 7, including an abrasive grain and an amide compound, in which the amide compound has a group forming a n conjugated system with a carbonyl group. The polishing composition can suppress an increase in electrical conductivity at a pH of less than 7 and polish both a silicon material and a metal oxide at a high polishing rate, in polishing of an object to be polished including the silicon material and the metal oxide.

A polishing rate of a polysilicon film can be increased using amines such as a quaternary ammonium salt described in JP 2017-57263 A. However, in an acidic region, since amines are present in a state of being a protonated conjugated acid, electrical conductivity of the polishing composition is increased. Also, amines are basic and increase a pH. Thus, an amount of an acid required to make the pH of less than 7 is also increased. Therefore, the electrical conductivity of the polishing composition is increased. When the electrical conductivity of the polishing composition is increased, a high polishing rate cannot be obtained in polishing of a metal oxide film. Therefore, the present inventor has considered that by using an amide compound, an increase in the electrical conductivity of the polishing composition can be suppressed, and thus a film containing a metal oxide can be polished at a high polishing rate.

However, the present inventor has found that for example, when an amide compound having a methyl group bonded to a carbonyl carbon is used, a metal oxide film can be polished at a high polishing rate, as compared with the case of using an amine, while a polishing rate of a film containing a silicon material is reduced. Therefore, as a result of the study, the present inventor has found that by using an amide compound having a group forming a n conjugated system with a carbonyl group, a film containing a silicon material can be polished at a polishing rate equal to or higher than the polishing rate when using an amine, without increasing the electrical conductivity. In the amide compound having a group forming a n conjugated system with a carbonyl group, electrons on a carbonyl carbon are delocalized to lower an electron density. Though the detailed reaction mechanism is unknown, it is considered that reactivity between the amide compound having a group forming a n conjugated system with a carbonyl group and the film containing a silicon material is increased to obtain a high polishing rate increase effect.

Hereinafter, an embodiment according to an aspect of the present invention will be described. The present invention is not limited to the following embodiment.

In the present specification, "X to Y" representing a range means "X or more and Y or less". Unless otherwise stated, operation and measurement of physical properties or the like is performed under the conditions of room temperature (20 to 25° C.)/a relative humidity of 40 to 50% RH.

<Polishing Composition>

[Abrasive Grain]

The polishing composition according to an embodiment of the present invention includes an abrasive grain.

The material and physical properties of the abrasive grain are not particularly limited, but can be appropriately selected according to, for example, the purpose of use or the mode of use of the polishing composition. Examples of the abrasive grain include an inorganic particle, an organic particle, and an organic inorganic composite particle. Specific examples of the inorganic particle include oxide particles such as silica particle, alumina particle, cerium oxide particle, chromium oxide particle, titanium dioxide particle, zirconium oxide particle, magnesium oxide particle, manganese dioxide particle, zinc oxide particle, and bengala particle; nitride particle such as silicon nitride particle and boron nitride particle; carbide particle such as silicon carbide particle and boron carbide particle; diamond particle; carbonate particle such as calcium carbonate particle and barium carbonate particle; and the like. Specific examples of the organic particle include polymethyl methacrylate (PMMA) particle, poly(meth)acrylate particle, polyacrylonitrile particle, and the like. In the present specification, (meth)acrylic acid refers to acrylic acid and methacrylic acid, inclusively. The abrasive grain may be used one member alone or in combination of two or more members.

As the abrasive grain above, an inorganic particle is preferred and among them, a particle formed of metal or semi-metal oxides is preferred. Particularly preferred examples of the abrasive grain include a silica particle. Examples of the silica particle include colloidal silica, fumed silica, precipitated silica, and the like.

Among the silica particles, colloidal silica and fumed silica are preferred and colloidal silica is particularly preferred.

The colloidal silica can be produced, for example, by a sol-gel method. The colloidal silica produced by the sol-gel method is preferred, since a content of metal impurities having diffusibility in a semiconductor and corrosive ions such as chloride ions is small. Production of colloidal silica by the sol-gel method can be performed by a conventionally known method, and specifically, colloidal silica can be obtained by performing hydrolysis/condensation reaction using a hydrolyzable silicon compound (for example, alkoxysilane or a derivative thereof) as a raw material.

The colloidal silica may have a cationic group. Preferred examples of the colloidal silica having a cationic group include colloidal silica having an amino group immobilized on the surface. Examples of a method of producing such colloidal silica having a cationic group include a method of immobilizing a silane coupling agent having an amino group such as aminoethyltrimethoxysilane, aminopropyltrimethoxysilane, aminoethyltriethoxysilane, aminopropyltriethoxysilane, aminopropyldimethylethoxysilane, aminopropylmethyldiethoxysilane, and aminobutyltriethoxysilane on a surface of the abrasive grain, as described in JP 2005-162533 A. Thus, it is possible to obtain the colloidal silica having an amino group immobilized on the surface (amino group-modified colloidal silica).

The colloidal silica may have an anionic group. Preferred examples of the colloidal silica having an anionic group include colloidal silica having an anionic group such as a carboxylic acid group, a sulfonic acid group, a phosphonic acid group, and an aluminate group immobilized on the surface. A method of producing such colloidal silica having an anionic group is not particularly limited, but examples thereof include a method of reacting a silane coupling agent having an anionic group at the end with colloidal silica.

As a specific example, when a sulfonic acid group is immobilized on colloidal silica, for example, a method described in "Sulfonic acid-functionalized silica through of thiol groups", Chem. Commun. 246-247 (2003) can be performed. Specifically, a silane coupling agent having a thiol group such as 3-mercaptopropyltrimethoxysilane is coupled to colloidal silica and then the thiol group is oxidized with hydrogen peroxide, thereby obtaining colloidal silica having a sulfonic acid group immobilized on the surface.

Alternatively, when a carboxylic acid group is immobilized on colloidal silica, for example, a method described in "Novel Silane Coupling Agents Containing a Photolabile 2-Nitrobenzyl Ester for Introduction of a Carboxy Group on the Surface of Silica Gel", Chemistry Letters, 3, 228-229 (2000) can be performed. Specifically, a silane coupling agent containing photoreactive 2-nitrobenzyl ester is coupled to colloidal silica and then is irradiated with light, thereby obtaining the colloidal silica having a carboxylic acid group immobilized on the surface.

A shape of the abrasive grain is not particularly limited, but may be spherical or non-spherical. Specific examples of the non-spherical shape include various shapes, such as a polygonal column shape such as a triangular column or a square column, a cylindrical shape, a bale shape in which the central part of the cylinder is more inflated than the end part, a donut shape in which the center part of a disk is penetrated, a plate shape, a so-called cocoon shape having constriction in the center part, a so-called assembly-typed spherical shape in which a plurality particles are integrated, a so-called konpeito-typed shape having a plurality of projections on the surface, a rugby ball shape, and the like, but not particularly limited thereto.

A size of the abrasive grain is not particularly limited, but the lower limit of an average primary particle size of the abrasive grain is preferably 5 nm or more, more preferably 7 nm or more, and still more preferably 10 nm or more. Also, in the polishing composition of the present invention, the upper limit of the average primary particle size of the abrasive grain is preferably 120 nm or less, more preferably 80 nm or less, and still more preferably 50 nm or less. Within such a range, defects such as scratches on the surface of the object to be polished after polishing using the polishing composition can be suppressed. That is, the average primary particle size of the abrasive grain is preferably 5 nm or more and 120 nm or less, more preferably 7 nm or more and 80 nm or less, and still more preferably 10 nm or more and 50 nm or less. In addition, the average primary particle size of the abrasive grain is calculated, for example, based on a specific surface area of the abrasive grain measured by the BET method.

In the polishing composition of the present invention, the lower limit of the average secondary particle size of the abrasive grain is preferably 10 nm or more, more preferably 20 nm or more, and still more preferably 30 nm or more. Further, in the polishing composition of the present invention, the upper limit of the average secondary particle size of the abrasive grain is preferably 250 nm or less, more preferably 200 nm or less, and still more preferably 150 nm or less. Within such a range, defects such as scratches on the surface of the object to be polished after polishing using the polishing composition can be suppressed. That is, the average secondary particle size of the abrasive grain is preferably 10 nm or more and 250 nm or less, more preferably 20 nm or more and 200 nm or less, and still more preferably 30 nm or more and 150 nm or less. In addition, the average secondary particle size of the abrasive grain can be measured, for example, by a dynamic light scattering method represented by a laser diffraction scattering method.

An average degree of association of the abrasive grain is preferably 5.0 or less, more preferably 3.0 or less, and still more preferably 2.5 or less. As the average degree of association of the abrasive grain decreases, production of defects on the surface of the object to be polished can be further reduced. Further, the average degree of association of the abrasive grain is preferably 1.0 or more, and more preferably 1.2 or more. As the average degree of association of the abrasive grain increases, there is an advantage that the polishing rate is improved by the polishing composition. Further, the average degree of association of the abrasive grain can be obtained by dividing the value of the average secondary particle size of the abrasive grain by the value of the average primary particle size of the abrasive grain.

The upper limit of an aspect ratio of the abrasive grain is not particularly limited, but preferably less than 2.0, more preferably 1.8 or less, and still more preferably 1.5 or less. Within such a range, defects on the surface of the object to be polished can be further reduced. In addition, the aspect ratio is an average of the values obtained by taking the smallest rectangle circumscribing an image of the abrasive particles by a scanning electron microscope and dividing a long side length of the rectangle by a short side length of the same rectangle, and can be determined using a general image analysis software. The lower limit of the aspect ratio of the abrasive grain is not particularly limited, but preferably 1.0 or more.

In a particle size distribution of the abrasive grain determined by a laser diffraction scattering method, the lower limit of D90/D10 which is a ratio of a particle diameter when an integrated particle weight from a fine particle side reaches 90% of the total particle weight (D90) to a particle diameter when an integrated particle weight reaches 10% of the total particle weight (D10), is not particularly limited, but preferably 1.1 or more, more preferably 1.2 or more, and still more preferably 1.3 or more. Further, in the particle size distribution of the abrasive grain in the polishing composition determined by a laser diffraction scattering method, the upper limit of D90/D10 which is a ratio of a particle diameter when an integrated particle weight from a fine particle side reaches 90% of the total particle weight (D90) to a particle diameter when an integrated particle weight reaches 10% of the total particle weight (D10), is not particularly limited, but preferably 2.04 or less. Within such a range, defects on the surface of the object to be polished can be further reduced.

The size of the abrasive grain (average primary particle size, average secondary particle size, aspect ratio, D90/D10, and the like) can be appropriately controlled by selecting a method of producing abrasive grain, and the like.

The lower limit of a content (concentration) of the abrasive grain in the polishing composition of the present invention is preferably 0.01% by mass or more, more preferably 0.05% by mass or more, and still more preferably 0.1% by mass or more. Further, in the polishing composition of the present invention, the upper limit of the content of the abrasive grain is preferably 20% by mass or less, more preferably 10% by mass or less, still more preferably 5% by mass or less, and further still more preferably 2% by mass or less. When the upper limit is as such, it is possible to further suppress an occurrence of surface defects on the surface of the object to be polished after polishing using the polishing composition. In addition, in a case in which the polishing composition includes two or more members of abrasive grains, the content of the abrasive grains is intended to be the total amount thereof.

[Amide Compound Having Group Forming π Conjugated System with Carbonyl Group]

The polishing composition according to an embodiment of the present invention includes an amide compound, and the amide compound has a group forming a π conjugated system with a carbonyl group. In the present specification, the amide compound having a group forming a π conjugated system with a carbonyl group is also simply referred to as "the amide compound according to the present invention".

The amide compound according to the present invention is not particularly limited as long as it has a group forming a π conjugated system with a carbonyl group, but is preferably the amide compound represented by the following Formula I:

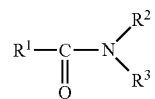

Formula I

In Formula I, $R^1$ is a substituted or unsubstituted, linear, branched, or cyclic hydrocarbon group of 2 to 20 carbon atoms having a carbon-carbon double bond, a substituted or unsubstituted aromatic hydrocarbon group of 6 to 20 carbon atoms, or a substituted or unsubstituted heterocyclic aromatic group; and $R^2$ and $R^3$ are each independently a hydrogen atom, an organic group, or a heteroatom-containing group, and $R^2$ and $R^3$ may form a cyclic structure.

When $R^1$ is a substituted or unsubstituted, linear, branched, or cyclic hydrocarbon group of 2 to 20 carbon atoms having a carbon-carbon double bond, it is preferred that the amide compound according to the present invention be the amide compound represented by the following Formula II:

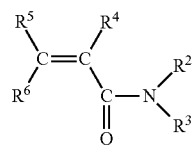

Formula II

In Formula II, $R^2$, $R^3$, $R^4$, $R^5$, and $R^6$ are each independently a hydrogen atom, an organic group, or a heteroatom-containing group, and $R^2$ and $R^3$, $R^4$ and $R^5$, and $R^5$ and $R^6$ may each independently form a cyclic structure.

Examples of a substituent include a halogen atom, a hydroxy group, an alkyl group (preferably having 1 to 20 carbon atoms), a hydroxyalkyl group (preferably having 1 to 20 carbon atoms), an alkoxy group (preferably having 1 to 20 carbon atoms), a cycloalkyl group (preferably having 3 to 20 carbon atoms), an alkenyl group (preferably having 2 to 20 carbon atoms), an aryl group (preferably having 6 to 20 carbon atoms), and the like.

Examples of the hydrocarbon group of 2 to 20 carbon atoms having a carbon-carbon double bond include a vinyl group, a 1-propenyl group, an isopropenyl group, a 1-butenyl group, a 2-butenyl group (1-methyl-1-propenyl, but-2-en-2-yl), an isobutenyl group, a 1-pentenyl group, a 2-pentenyl group (1-methyl-1-butenyl, 1-ethyl-1-propenyl, pent-2-en-3-yl, pent-2-en-2-yl), a 1-hexenyl group, a 1-heptenyl group, a 1-octenyl group, a 1-nonenyl group, a 1-decenyl group, a 2-dodecenyl group, a 1-octadecenyl group, a 1-icosenyl group, a 1-cyclobutenyl group, a 1-cyclopentenyl group, a 1-cyclohexenyl group, a 1-cycloheptenyl group, a pentalenyl group, an indenyl group, a fluorenyl group, a biphenylyl group, a pyranyl group, a thiopyranyl group, an isothiochromenyl group, a pyrazolyl group, and the like. Among them, a vinyl group, a 1-propenyl group, an isopropenyl group, a 1-butenyl group, a 2-butenyl group, and an isobutenyl group are preferred.

Examples of the aromatic hydrocarbon group of 6 to 20 carbon atoms include a phenyl group, a naphthyl group, an anthracenyl group, a tetracenyl group, a chrysenyl group, a triphenyl group, a tetraphenyl group, a pyrenyl group, a phenanthryl group, and the like. Among them, a phenyl group and a naphthyl group are preferred.

Examples of the heterocyclic aromatic group include a thienyl group, a pyrrolyl group, an imidazolyl group, a pyridyl group, a pyrazinyl group, a pyrimidinyl group, a pyridazinyl group, a thiazolyl group, an isothiazolyl group, a furanyl group, a benzimidazolyl group, a quinolizinyl group, and the like. Among them, an imidazolyl group, a pyridyl group, a pyrazinyl group, a pyrimidinyl group, a pyridazinyl group, a thiazolyl group, and an isothiazolyl group are preferred.

Examples of the organic group include a substituted or unsubstituted hydrocarbon group having 1 to 20 carbon atoms, a substituted or unsubstituted aromatic hydrocarbon group having 6 to 20 carbon atoms, and the like. The hydrocarbon group may be saturated or unsaturated and may be linear, branched, or cyclic.

Examples of the hydrocarbon group having 1 to 20 carbon atoms include alkyl groups such as a methyl group, an ethyl group, a propyl group, an isopropyl group, a butyl group, an isobutenyl group, a sec-butyl group, a tert-butenyl group, a pentyl group, a hexyl group, an isohexyl group, a heptyl group, an octyl group, a 2-ethylhexyl group, a nonyl group, a decyl group, an undecyl group, a dodecyl group, a tetradecyl group, a pentadecyl group, a hexadecyl group, a heptadecyl group, an octadecyl group, a nonadecyl group, an eicosyl group; cycloalkyl groups such as a cyclobutyl group, a cyclopentyl group, a cyclohexyl group, and a cycloheptyl group, and the like. Further, examples of the hydrocarbon group having 1 to 20 carbon atoms also include a hydrocarbon group of 2 to 20 carbon atoms having a carbon-carbon double bond, and furthermore, a 2-butenyl group, a 2-pentenyl group, a 2-dodecenyl group, and the like.

Examples of the aromatic hydrocarbon group having 6 to 20 carbon atoms include the aromatic hydrocarbon group as described above.

Examples of the heteroatom forming the heteroatom-containing group include an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the heteroatom-containing group include halogen atoms such as a fluorine atom, a chlorine atom, a bromine atom, and an iodine atom, a hydroxyl group, a carboxy group, a cyano group, an amino group, a sulfanyl group, and the like.

The number of ionic functional group contained in the amide compound according to the present invention is preferably up to one (one or zero), and more preferably zero. Examples of the ionic functional group include a carboxyl group, a sulfonic acid group, a sulfinic acid group, a sulfenic acid group, a phosphoric acid group, a phosphonic acid group, an amino group, and salts thereof.

The concentration of the amide compound according to the present invention is not particularly limited, but preferably 0.1 mM or more, more preferably 0.5 mM or more, and still more preferably 1.0 mM or more. Further, the upper limit of the concentration of the amide compound according to the present invention is preferably 50 mM or less, more preferably 25 mM or less, and still more preferably 10 mM or less. That is, the concentration of the amide compound according to the present invention is preferably 0.1 mM or more and 50 mM or less, more preferably 0.5 mM or more and 25 mM or less, and still more preferably 0.5 mM or more and 10 mM or less. Within such a range, a film containing a silicon material can be polished at a high polishing rate without increasing the electrical conductivity of the polishing composition. In addition, when the polishing composition includes two or more amide compounds according to the present invention, the content of the amide compound according to the present invention is intended to be the total amount thereof.

[Dispersing Medium or Solvent]

The polishing composition according to an embodiment of the present invention may include a dispersing medium or solvent. The dispersing medium or solvent is preferably water. From a viewpoint of preventing an influence of impurities on other components of the polishing composition, it is preferred to use water as pure as possible. Specifically, pure water or ultrapure water from which foreign matters have been removed through a filter after removing impurity ions by an ion exchange resin, or distilled water is preferred. Further, as the dispersing medium or solvent, an organic solvent or the like may be further included, for the purpose of controlling dispersibility or the like of other components of the polishing composition.

[PH of Polishing Composition]

The polishing composition according to an embodiment of the present invention has a pH of less than 7. When the pH is 7 or more, a metal oxide (for example, $AlO_x$) film cannot be polished at high polishing rate.

The pH of the polishing composition can be grasped using a pH meter (for example, a glass electrode hydrogen ion concentration indicator (model number: F-23) manufactured by Horiba, Ltd.), by performing 3-point calibration using a standard buffer solution (a phthalate salt pH buffer solution pH: 4.01 (25° C.), a neutral phosphate salt pH buffer solution pH: 6.86 (25° C.), a carbonate salt pH buffer solution pH: 10.01 (25° C.)), then placing a glass electrode in the polishing composition, and measuring the value after stabilization for 2 minutes or more.

(pH Adjusting Agent)

The polishing composition according to an embodiment of the present invention can include a pH adjusting agent for making the pH of less than 7.

The pH adjusting agent is not particularly limited, but the following acids can be used.

Examples of the acid include organic acids and inorganic acids. Examples of the organic acid include formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellic acid, cinnamic acid, oxalic acid, malonic acid, tartaric acid, succinic acid, glutaric acid, adipic acid, fumaric acid, maleic acid, aconitic acid, amino acid, carboxylic acid such as nitrocarboxylic acid, and sulfonic acid such as methanesulfonic acid, ethanesulfonic acid, benzenesulfonic acid, p-toluenesulfonic acid, 10-camphorsulfonic acid, isethionic acid, and taurine. Further, examples of the inorganic acid include carbonic acid, hydrochloric acid, nitric acid, phosphoric acid, hypophosphorous acid, phosphorous acid, phosphonic acid, sulfuric acid, boric acid, hydrofluoric acid, orthophosphoric acid, pyrophosphoric acid, polyphosphoric acid, metaphosphoric acid, hexametaphosphoric acid, and the like.

The pH adjusting agent can be used alone or in combination of two or more. Among the pH adjusting agents, malonic acid and tartaric acid are preferred.

The addition amount of the pH adjusting agent is not particularly limited, but the addition amount may be appropriately selected so as to be the above pH range.

[Other Components]

The polishing composition of the present invention may further include other components such as a complexing agent, a metal anticorrosive, an antiseptic agent, an antifungal agent, an oxidizing agent, a reducing agent, a surfactant, a water-soluble polymer, and an organic solvent for dissolving a poorly soluble organic substance, if necessary. Hereinafter, an oxidizing agent, a metal anticorrosive, an antiseptic agent, and an antifungal agent which are preferred components will be described.

(Oxidizing Agent)

The oxidizing agent which can be added to the polishing composition serves to oxidize the surface of the object to be polished and improves a polishing rate of the object to be polished by the polishing composition.

Examples of the usable oxidizing agent include hydrogen peroxide, sodium peroxide, barium peroxide, an organic oxidizing agent, ozone water, silver (II) salt, iron (III) salt, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypochlorous acid, hypoiodic acid, chloric acid, chlrorous acid, perchloric acid, bromic acid, iodic acid, periodic acid, persulfuric acid, dichloroisocyanuric acid, and salts thereof, and the like. The oxidizing agent may be used alone or in combination of two or more. Among them, hydrogen peroxide, ammonium persulfate, periodic acid, hypochlorous acid, and sodium dichloroisocyanurate are preferred.

The content of the oxidizing agent in the polishing composition is preferably 0.1 g/L or more, more preferably 1 g/L or more, still more preferably 3 g/L or more. As the content of the oxidizing agent increases, the polishing rate of the object to be polished by the polishing composition is further improved.

The content of the oxidizing agent in the polishing composition is also preferably 200 g/L or less, more preferably 100 g/L or less, and still more preferably 40 g/L or less. As the content of the oxidizing agent decreases, a load on treatment of the polishing composition after use in polishing, that is, waste water treatment can be reduced, in addition to being able to reduce the material cost of the polishing composition. Further, a possibility of causing excessive oxidation on the surface of the object to be polished by the oxidizing agent can be decreased.

(Metal Anticorrosive)

By adding a metal anticorrosive to the polishing composition, an occurrence of a recess beside a wire during polishing using the polishing composition can be further suppressed. Further, an occurrence of dishing on the surface of the object to be polished after polishing using the polishing composition can be further suppressed.

The metal anticorrosive which can be used is not particularly limited, but is preferably a heterocyclic compound or a surfactant. The number of members of the heterocyclic ring in the heterocyclic compound is not particularly limited. Further, the heterocyclic compound may be a monocyclic compound or a polycyclic compound having a fused ring. The metal anticorrosive may be used alone or in combination of two or more. Further, as the metal anticorrosive, a commercially available product may be used or a synthesized product may be used.

Specific examples of the heterocyclic compound which can be used as the metal anticorrosive include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buteridin compound, a thiazole compound, an isothiazole compound, an oxazole compound, an isoxazole compound, and a furazan compound.

(Antiseptic Agent and Antifungal Agent)

Examples of the antiseptic agent and the antifungal agent which can be added to the polishing composition according to the present invention include isothiazoline-based antiseptic agents such as 2-methyl-4-isothiazolin-3-one and 5-chloro-2-methyl-4-isothiazolin-3-one, p-hydroxybenzoic acid esters, phenoxyethanol, and the like. The antiseptic agent and the antifungal agent may be used alone or in combination of two or more.

[Object to be Polished]

The object to be polished which is polished using the polishing composition according to an embodiment of the present invention is not particularly limited, but can be applied to polishing of the object to be polished having various materials and shapes. Examples of the material of the object to be polished include silicon materials such as polysilicon, amorphous silicon, and a silicon single crystal; metal oxides such as aluminum oxide ($AlO_x$), magnesium oxide ($MgO_x$), gallium oxide ($GaO_x$), hafnium oxide ($HfO_x$), lanthanum oxide ($LaO_x$), zirconium oxide ($ZrO_x$), cerium oxide ($CeO_x$), titanium oxide ($TiO_x$), $MgAlO_x$, and $HfMgO_x$; metal or semimetal such as aluminum, nickel, tungsten, steel, tantalum, titanium, and stainless steel, or alloys thereof; glassy substances such as quarts glass, aluminosilicate glass, and glassy carbon; ceramic materials such as alumina, silica, sapphire, silicon nitride, tantalum nitride, and titanium carbide; compound semiconductor substrate materials such as silicon carbide, gallium nitride, and gallium arsenide; resin materials such as a polyamide resin; and the like. Further, the object to be polished may be made of a plurality of materials among the above materials.

Among them, the material of the object to be polished preferably includes at least one of a silicon material and a metal oxide, and more preferably includes a silicon material and a metal oxide, from a viewpoint of further obtaining the effect of the present invention.

The silicon material preferably includes at least one of polysilicon and amorphous silicon, and more preferably, is polysilicon, from a viewpoint of more significantly obtaining the effect of the present invention.

The metal oxide preferably includes at least one selected from the group consisting of $AlO_x$, $MgO_x$, $GaO_x$, $HfO_x$, $LaO_x$, $ZrO_x$, $CeO_x$, $TiO_x$, $MgAlO_x$, and $HfMgO_x$, and more preferably includes $AlO_x$, from a viewpoint of more significantly obtaining the effect of the present invention.

The material of the object to be polished preferably includes at least one of polysilicon and amorphous silicon and at least one selected from the group consisting of $AlO_x$, $MgO_x$, $GaO_x$, $HfO_x$, $LaO_x$, $ZrO_x$, $CeO_x$, $TiO_x$, $MgAlO_x$, and $HfMgO_x$, and more preferably includes polysilicon and aluminum oxide ($AlO_x$). Therefore, in a preferred embodiment, the polishing composition according to an embodiment of the present invention is used to polish the object to be polished including polysilicon and a metal oxide.

<Method of Producing Polishing Composition>

A method of producing the polishing composition according to an embodiment of the present invention is not particularly limited, but for example, the polishing composition can be obtained by stirring and mixing an abrasive grain and an amide compound according to the present invention, and other components if necessary in a dispersing medium or a solvent. The pH adjusting agent can be used as appropriate, for making the pH of the polishing composition less than 7. Therefore, according to an embodiment of the present invention, there is provided a method of producing the polishing composition, including mixing the abrasive grain and the amide compound.

The temperature at which each component is mixed is not particularly limited, but is preferably 10 to 40° C., and heating may be performed for increasing a rate of dissolution.

<Polishing Method>

As mentioned above, the polishing composition according to an embodiment of the present invention is preferably used to polish the object to be polished including polysilicon and a metal oxide. Therefore, according to an embodiment of the present invention, there is provided a polishing method including polishing an object to be polished including polysilicon and a metal oxide, using the polishing composition.

As a polishing apparatus, a general polishing apparatus in which a holder for holding a substrate having the object to be polished and the like, a motor of which the rotational speed can be changed, and the like are mounted, and having a polishing table to which a polishing pad (polishing cloth) is attachable, can be used.

As the polishing pad, general non-woven fabric, polyurethane, porous fluororesin, and the like can be used without particular limitation. It is preferred that the polishing pad is subjected to grooving so that a polishing solution is collected.

For polishing conditions, for example, a rotational speed of the polishing table is preferably 10 rpm (0.17 s$^{-1}$) or more and 500 rpm (8.3 s$^{-1}$) or less. A pressure (polishing pressure) applied to a substrate having the object to be polished is preferably 0.5 psi (3.4 kPa) or more and 10 psi (68.9 kPa) or less. A method of supplying the polishing composition to the polishing pad is not particularly limited, but, for example, a method of continuously supplying the polishing composition with a pump or the like is adopted. Though the amount to be supplied is not limited, it is preferred that the surface of the polishing pad be always covered with the polishing composition according to an embodiment of the present invention.

After completion of polishing, the substrate is washed in flowing water, and water droplets adhered on the substrate are removed and the substrate is dried by a spin dryer or the like, thereby obtaining a substrate having a metal-containing layer.

The polishing composition according to an embodiment of the present invention may be a one-pack type or may be a multi-pack type including a two-pack type. Further, the polishing composition according to an embodiment of the present invention may be prepared by diluting a stock solution of the polishing composition, for example, 10 times or more, using a diluent such as water.

EXAMPLES

The present invention will be described in more detail, by means of the following Examples and Comparative Examples. However, the technical scope of the present invention is not limited to the following Examples. In addition, unless otherwise stated, "%" and "parts" mean "% by mass" and "parts by mass", respectively. Further, in the following Examples, unless otherwise stated, operation was performed under the condition of room temperature (20° C. or more and 25° C. or less)/relative humidity of 40% RH or more and 50% RH or less.

<Preparation of Polishing Composition>

Example 1

An amino group-modified colloidal silica (an average primary particle size of 31 nm, an average secondary particle size of 62 nm, and an average degree of association of 2.0) of 1.75% by mass as an abrasive grain, based on 100% by mass of the total mass of the polishing composition and dimethyl acrylamide of 5 mM were added to water. Thereafter, the reactants were stirred and mixed at room temperature (25° C.) for 30 minutes and malonic acid as a pH adjusting agent was used to adjust the pH to 4.8, thereby preparing the polishing composition.

Example 2

A polishing composition was prepared in the same manner as in Example 1, except that dimethyl acrylamide was changed to nicotinamide.

Example 3

A polishing composition was prepared in the same manner as in Example 1, except that dimethyl acrylamide was changed to isonicotinamide.

Example 4

A polishing composition was prepared in the same manner as in Example 1, except that dimethyl acrylamide was changed to pyrazinamide.

Example 5

A polishing composition was prepared in the same manner as in Example 1, except that dimethyl acrylamide was changed to anthranilamide.

Comparative Example 1

An amino group-modified colloidal silica (an average primary particle size of 31 nm, an average secondary particle size of 62 nm, and an average degree of association of 2.0) of 1.75% by mass as an abrasive grain, based on 100% by mass of the total mass of the polishing composition was added to water. Thereafter, the reactants were stirred and mixed at room temperature (25° C.) for 30 minutes and malonic acid as a pH adjusting agent was used to adjust the pH to 4.8, thereby preparing the polishing composition.

Comparative Example 2

A polishing composition was prepared in the same manner as in Example 1, except that dimethyl acrylamide was changed to 2-(dimethylamino)-2-methyl-1-propanol.

Comparative Example 3

A polishing composition was prepared in the same manner as in Example 1, except that dimethyl acrylamide was changed to N-methyl acetamide.

<Measurement of Average Primary Particle Size of Abrasive Grain>

The average primary particle size of abrasive grains was calculated from a specific surface area of abrasive grains by the BET method measured using "Flow Sorb II 2300" manufactured by Micromeritics, and a density of abrasive grains.

<Measurement of Average Secondary Particle Size of Abrasive Grain>

The average secondary particle size of abrasive grains was measured by a dynamic light scattering particle size/particle size distribution apparatus, UPA-UTI151 manufactured by Nikkiso Co., Ltd.

<Measurement of pH of Polishing Composition>

The pH of the polishing composition (liquid temperature: 25° C.) was confirmed by a pH meter (manufactured by Horiba, Ltd., model number: LAQUA).

<Measurement of Electrical Conductivity of Polishing Composition>

The electrical conductivity of the polishing composition was measured by a tabletop-type electrical conductivity meter (manufactured by Horiba, Ltd., model number: DS-71).

<Polishing Performance Evaluation>

A silicon wafer (300 mm wafer) on which a film of polysilicon was deposited at a thickness of 5000 Å and a silicon wafer (300 mm wafer) on which a film of $AlO_x$ was deposited at a thickness of 1000 Å were prepared, the polishing compositions obtained above were used to polish each wafer under the following polishing conditions, and a polishing rate was measured.

(Polishing Conditions)

Polishing machine: REFLEXION (registered trademark) LK (manufactured by Applied Materials, Inc.)

Polishing pad: IC1010 pad (manufactured by Dow Chemical Company)

Pressure: 2.0 psi (1 psi=6894.76 Pa)
Rotational speed of platen: 88 rpm
Rotational speed of head (carrier): 88 rpm
Flow rate of polishing composition: 200 ml/min
Polishing time:
60 seconds (silicon wafer on which a film of polysilicon is deposited at a thickness of 5000 Å)
15 seconds (silicon wafer on which a film of $AlO_x$ is deposited at a thickness of 1000 Å).

(Polishing Rate)

A polishing rate (removal rate; RR) was calculated by the following Equation:

$$\text{Polishing rate } [\text{Å/min}] = \frac{\text{Film thickness before polishing [Å]} - \text{Film thickness after polishing [Å]}}{\text{Polishing time [min]}}$$

The film thickness was determined by a light interference type film thickness measurement apparatus (manufactured by KLA-Tencor Corporation, model No: ASET-f5x), and the polishing rate was evaluated by dividing a difference between the film thicknesses before and after polishing by a polishing time. The results are shown in Table 1.

TABLE 1

| | Compound added | Number of ionic functional groups | Polishing rate [Å/min] Polysilicon | Polishing rate [Å/min] $AlO_x$ | Electrical conductivity [μS/cm] |
|---|---|---|---|---|---|
| Example 1 | Dimethyl acrylamide | 0 | 1185 | 1384 | 41 |
| Example 2 | Nicotinamide | 0 | 1111 | 1406 | 44 |
| Example 3 | Isonicotinamide | 0 | 1043 | 1422 | 42 |
| Example 4 | Pyrazinamide | 0 | 1153 | 1415 | 39 |
| Example 5 | Anthranilamide | 1 | 917 | 1230 | 45 |
| Comparative Example 1 | — | — | 413 | 1402 | 39 |
| Comparative Example 2 | 2-(dimethylamino)-2-methyl-1-propanol | — | 1237 | 72 | 352 |
| Comparative Example 3 | N-methyl acetamide | — | 786 | 1380 | 38 |

As apparent from the above Table 1, it can be seen that the polishing composition includes the amide compound having a group forming a π conjugated system with a carbonyl group, whereby the polishing composition of the Examples can suppress an increase in the electrical conductivity even at a pH of less than 7, and also, both a polysilicon film and an $AlO_x$ film can be polished at a high polishing rate Meanwhile, it can be seen that the polishing composition of Comparative Example 2 increases the electrical conductivity as a result of inclusion of an amine compound, and thus, cannot polish the $AlO_x$ film at a high polishing rate. Further, it can be seen that the polishing composition of Comparative Example 3 can suppress an increase in the electrical conductivity, but cannot polish the polysilicon film at a high polishing rate.

The present application is based on the Japanese patent application No. 2018-176459 filed on Sep. 20, 2018, and a disclosed content thereof is entirely incorporated herein by reference.

What is claimed is:

1. A polishing composition having a pH of less than 7, consisting of an abrasive grain, an amide compound, a dispersing medium or solvent, and a pH adjusting agent, wherein the amide compound has a group forming a π conjugated system with a carbonyl group.

2. The polishing composition according to claim 1, wherein the amide compound is represented by the following Formula I:

Formula I wherein $R^1$ is a substituted or unsubstituted, linear, branched, or cyclic hydrocarbon group of 2 to 20 carbon atoms having a carbon-carbon double bond, a substituted or unsubstituted aromatic hydrocarbon group of 6 to 20 carbon atoms, or a substituted or unsubstituted heterocyclic aromatic group; and $R^2$ and $R^3$ are each independently a hydrogen atom, an organic group, or a heteroatom-containing group, and $R^2$ and $R^3$ optionally form a cyclic structure.

3. The polishing composition according to claim 1, wherein the amide compound has up to one ionic functional group.

4. The polishing composition according to claim 1, wherein the polishing composition is used for polishing an object to be polished including polysilicon and a metal oxide.

5. A method of producing the polishing composition according to claim 1, comprising mixing the abrasive grain and the amide compound.

6. A polishing method, comprising polishing an object to be polished including polysilicon and a metal oxide with the polishing composition according to claim 1.

7. The polishing composition according to claim 1, wherein the polishing composition has a pH of 4.8 or less.

8. The polishing composition according to claim 1, wherein the dispersing medium or solvent is water.

9. The polishing composition according to claim 1, wherein the pH adjusting agent is selected from the group consisting of formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellic acid, cinnamic acid, oxalic acid, malonic acid, tartaric acid, succinic acid, glutaric acid, adipic acid, fumaric acid, maleic acid, aconitic acid, amino acid, carboxylic acid, nitrocarboxylic acid, sulfonic acid, methanesulfonic acid, ethanesulfonic acid, benzenesulfonic acid, p-toluenesulfonic acid, 10-camphorsulfonic acid, isethionic acid, taurine, carbonic acid, phosphoric acid, hypophosphorous acid, phosphorous acid, phosphonic acid, sulfuric acid, boric acid, orthophosphoric acid, pyrophosphoric acid, polyphosphoric acid, metaphosphoric acid, and hexametaphosphoric acid.

* * * * *